United States Patent [19]
Larsson

[11] Patent Number: 5,487,179
[45] Date of Patent: Jan. 23, 1996

[54] ARRANGEMENT FOR DUPLEX TRANSMISSION HAVING TRANSMITTER POWER CONTROL

[75] Inventor: Jan A. Larsson, Torna Hällestad, Sweden

[73] Assignee: Ericsson GE Mobile Communications Inc., Research Triangle Park, N.C.

[21] Appl. No.: 191,170

[22] Filed: Feb. 3, 1994

[30] Foreign Application Priority Data

Feb. 5, 1993 [SE] Sweden .................................. 9300349

[51] Int. Cl.⁶ .......................... H04B 1/48; H04B 1/04; H01Q 11/12
[52] U.S. Cl. ................. 455/69; 455/82; 455/126; 370/32
[58] Field of Search ..................... 455/78, 115, 79, 455/116, 117, 82, 126, 83, 84, 90; 333/194, 132, 1.1, 202; 370/32

[56] References Cited

U.S. PATENT DOCUMENTS

| | | | |
|---|---|---|---|
| 4,380,822 | 4/1983 | Broton | 455/82 |
| 4,509,165 | 4/1985 | Tamura | 455/83 |
| 4,792,939 | 12/1988 | Hikita et al. | 455/86 |
| 4,811,421 | 3/1989 | Havel et al. | 455/126 |
| 4,939,487 | 7/1990 | Yuhara et al. | 333/193 |
| 5,086,508 | 2/1992 | Furuno | 455/115 |
| 5,130,681 | 7/1992 | Ohnuki et al. | 333/194 |
| 5,212,814 | 5/1993 | Iwane | 455/126 |
| 5,212,815 | 5/1993 | Schumacher | 455/126 |
| 5,266,909 | 11/1993 | Wolfert | 333/1.1 |
| 5,319,328 | 6/1994 | Turunen | 333/202 |
| 5,333,176 | 7/1994 | Barke et al. | 455/90 |

FOREIGN PATENT DOCUMENTS 401737  12/1990  European Pat. Off. .

*Primary Examiner*—Edward F. Urban
*Assistant Examiner*—Lisa Charouel
*Attorney, Agent, or Firm*—Burns, Doane, Swecker & Mathis

[57] ABSTRACT

An arrangement for duplex transmission in a radio or similar device with a transmitter and receiver comprises a transmitter filter, receiver filter and preferably a transmitter/receiver device. The receiver filter may be a surface acoustic wave filter, and the transmitter filter and receiver filter are connected via a circulator. The arrangement also comprises a power detecting device for detecting the power into the receiver filter, and the power detecting device provides a feed-back signal to an arrangement for controlling the power out from a power amplifier arranged in front of the transmitter filter.

17 Claims, 1 Drawing Sheet

ARRANGEMENT FOR DUPLEX TRANSMISSION HAVING TRANSMITTER POWER CONTROL

BACKGROUND

The present invention relates to an apparatus or arrangement for duplex transmission in a radio or similar device with a transmitter and receiver, wherein the arrangement comprises a transmitter filter, a receiver filter and preferably a transmitter/receiver device which is fixedly or demountably arranged, wherein the receiver filter comprises a SAW-filter (Surface Acoustic Wave filter) and the transmitter filter and the SAW-filter are connected via a circulator.

This application claims priority from Swedish Patent Application No. 9300349-9, filed Feb. 5, 1993, which is expressly incorporated here by reference.

The filters of such an arrangement, on which the requirements are high, i.e., as far as selectivity, through-attenuation, etc. are concerned, are today large, among other reasons because of physically large resonators. Therefore, arrangements of the given kind are difficult to integrate due to their size which can be both time consuming as well as leading to increased costs. Furthermore, the products comprising said arrangement are large and cumbersome which can be of great significance for the intended application as well as its use and utilization as such. An example where it is significant that the size of such arrangements can be limited are hand-held telephones, particularly so called analog cellular pocket telephones.

Arrangements as referred to above are known. According to a known embodiment, a duplex filter is arranged between a transmitter and a receiver which have a receiver filter and a transmitter filter wherein between the filters an antenna is arranged. With known embodiments either ceramic filters or "helical" filters are used as transmitter filters as well as receiver filters. Those filters, however, have physically large resonators; as a result, the arrangement of the components will get large and difficult to integrate into customer specific circuits, such as for example ASICs (Application Specific Integrated Circuits).

These arrangements are used in, among other things, analog cellular hand-held telephones which also will be large among other reasons because the duplex filters are large. This is a drawback in portable telephones since it is essential that these are small and easy to handle in order to become really customer friendly. The requirements of the market get higher and higher in respect thereof. Even if also other factors play a role, such as, e.g., batteries, involved electronics, etc., the filter size is a very important factor.

SUMMARY

An object of the present invention is to provide an apparatus for duplex transmission in a radio or similar device with a transmitter and receiver as stated above which is physically small, easy to integrate at the same time as it fulfills high requirements as to a high selectivity, low through-attenuation, a high Q etc. Particularly, the object of the arrangement is to attenuate transmitted power into the receiver so that this gets blocked, to attenuate noise from the transmitter into the receiver on the receiving frequency, to attenuate overtones from transmitter to antenna, to attenuate local oscillator frequency from receiver to antenna, to attenuate image frequencies into the receiver from the antenna, to attenuate frequencies which may cause intermodulation in the transmitter and arrive at the receiver frequency, arrange for the through-attenuation at the transmitting frequency from transmitter to antenna to be low, as well as to provide that the through-attenuation at the receiving frequency from antenna to transmitter is low, which however are normal requirements on duplex filters.

The object of the invention is further to provide that more or less the same requirements and performance can be fulfilled as with known duplex filters with a considerably smaller surface and the volume respectively of the arrangement.

It is furthermore an object of the invention to provide an arrangement which is simple and cheap to fabricate at the same time as the performance is good and which is easy to handle and which is small.

An apparatus through which these as well as other objects are achieved is provided through an arrangement as initially stated which comprises a power detecting arrangement for detecting and measuring the power into the receiver filter or the SAW-filter, the power detecting arrangement providing a feed-back signal to a controlling arrangement for controlling the power out from a power amplifier in front of the transmitter filter.

According to one embodiment, the transmitter filter may comprise a conventional so called ceramic filter but may also comprise a so called helical filter. According to a preferred embodiment, the detecting means arranged between the circulator and the SAW-filter comprises a directional coupler. Particularly, the power detecting device may comprise a first directional coupler arranged between the circulator and the SAW-filter and a second directional coupler arranged in front of the transmitter filter. According to an alternate embodiment, the power detecting device may comprise a first directional coupler arranged between the circulator and the SAW-filter and a second directional coupler arranged between the transmitter filter and the circulator. The power amplifier is arranged in front of the transmitter and advantageously a second directional coupler is arranged between the power amplifier and the transmitter filter.

The power detecting device is advantageously connected to a power regulator for controlling the transmitter power. The power regulator particularly comprises a so called PI-regulator which controls the power out from the power amplifier. According to one embodiment of the invention, the circulator has a through-attenuation of approximately 0.8 dB and a reverse isolation of preferably more than 12 dB. Particularly, inputs and outputs respectively between the transmitter, receiver and antenna are loaded with an impedance of approximately 50 Ω.

If the attenuation from the transmitter to the receiver is not sufficient, the transmitted power received by the receiver filter will be too high and the receiver filter might, e.g., be damaged. Therefore, the power to be received by the receiver filter is sensed and measured and a signal is fed back to a control device to reduce the power from the transmitter or the power amplifier. The power can be reduced via a power regulator, the amplification in the amplifier can be reduced, or separate means such as a variable attenuating means or similar device can be used. The power may, e.g., have to be reduced if the transmitter/receiver device (e.g., an antenna) loads the circulator too much or incorrectly, or in an undesired manner.

BRIEF DESCRIPTION OF THE DRAWINGS

The invention will be further described with reference to the accompanying drawings in an explanatory and by no

DETAILED DESCRIPTION

Figure 1:
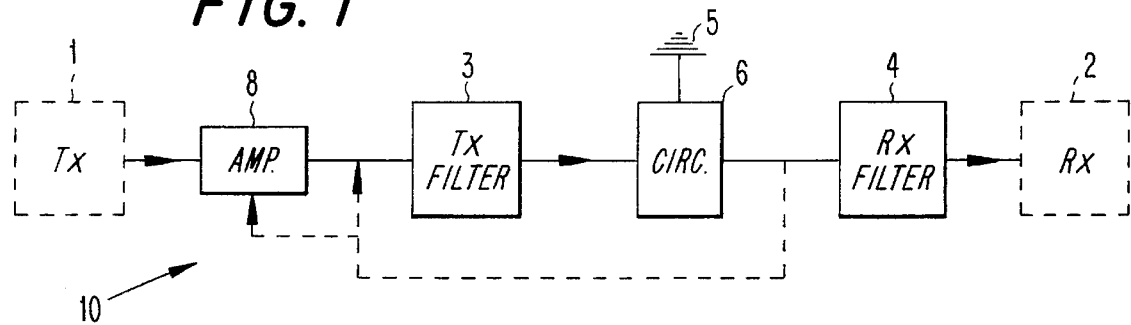
FIG. 1 illustrates a block diagram of the arrangement.

In FIG. 1 an apparatus or arrangement 10 for duplex transmission between a transmitter 1 and a receiver 2 in a radio is illustrated. The arrangement comprises a transmitter filter 3, a receiver filter 4 and a transmitter/receiver device 5 in a form of an antenna. Generally the transmitter/receiver device 5 could also comprise a cable or similar, not shown. The transmitter filter 3 then comprises a conventional ceramic filter but it could also be a so called helical filter or any other filter. The receiver filter however comprises a so called SAW-filter (Surface Acoustic Wave Filter) which is arranged in the receiver branch. Also the transmitter filter 3 might in some cases comprise a SAW-filter, when the power is lower or more power resistant SAW-filters have been produced. The SAW-filter normally has a volume which is smaller than 1/20 of the corresponding ceramic or similar filter. In FIG. 1 is not properly shown any detecting and controlling arrangements, this is merely indicated by a dashed line to illustrate the feed-back loop. As is illustrated in FIGS. 1 and 2, the controlling of the power out from the amplifier 8 can be provided also via separate means 10 arranged after the amplifier 8.

Figure 4:
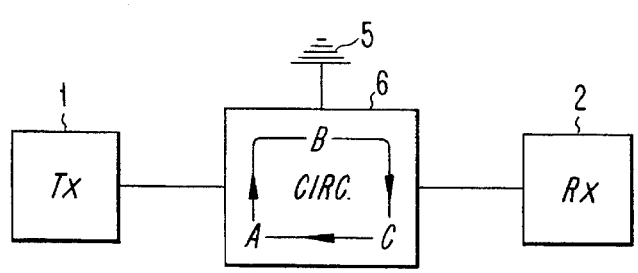

In FIG. 4 is schematically illustrated the functioning of the circulator 6. A B C illustrate connections and according to a preferred embodiment the circulator has a through damping of approximately 0.8 dB from the connection A to B, from B to C, and from C to A. The reverse isolation is at least 12 dB, i.e., from connection B to A, A to C, and finally from C to B. For a good functioning of the circulator, all inputs and outputs are loaded with an impedance of 50 Ω whereby the back isolation can be kept high.

Figure 2:
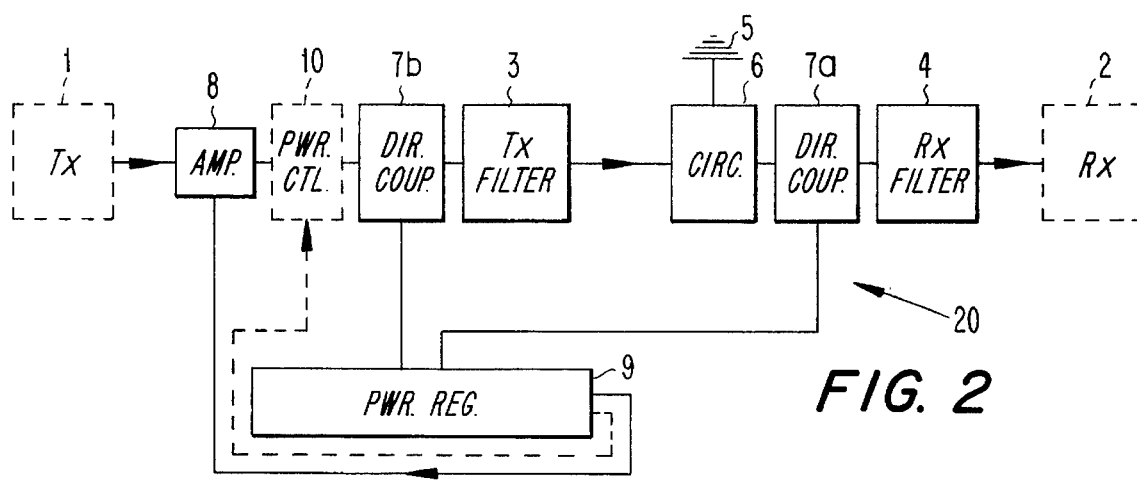
FIG. 2 illustrates a block diagram of the arrangement showing power detecting and power controlling devices.

In FIG. 2 an advantageous embodiment is illustrated in which a power detecting device 7 is arranged which comprises a first directional coupler 7a arranged between the circulator 6 and the receiver filter 4 and a second directional coupler 7b arranged between a power amplifier 8 and the transmitter filter 3. The detecting means, the directional couplers 7a, 7b, are connected to a power regulator 9 which controls or regulates the power out from the power amplifier 8. This regulator may, e.g., comprise a PI-regulator. In the case of a non-advantageous loading of the antenna, e.g., if the standing-wave ratio on connection B is too big or if the antenna 5 is not connected, then the attenuation from the transmitter 1 to the receiver 2 is too small and a too large transmitted power is received in the receiver filter 4 which therefore in some cases can be damaged. Therefore, the power into the receiver filter 4 is detected which is used for reducing the power output of the power amplifier 8 if the antenna 5 loads the circulator 6 the wrong way, i.e., if the isolation in the circulator 6 is too low.

Figure 3:
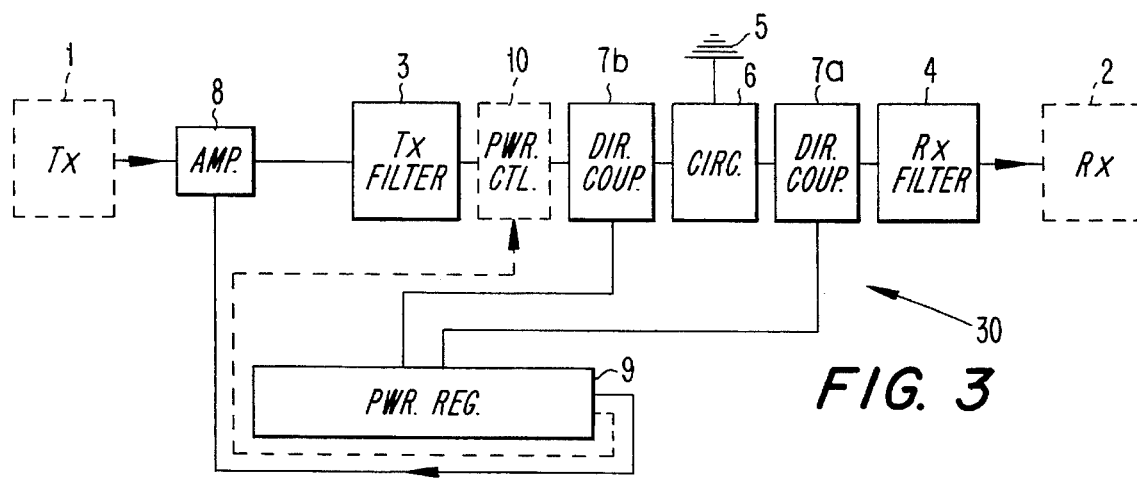
FIG. 3 illustrates a second embodiment of the arrangement showing power detecting and power controlling devices, and FIG. 4 schematically illustrates the interconnection of the transmitter, antenna, and receiver.

FIG. 3 illustrates an arrangement corresponding to that of FIG. 2 but wherein the second detecting means 7b, which particularly may be a directional coupler, is arranged behind the transmitter filter but in front of the circulator 6. In other aspects the arrangement works in a way analogous to what has been described in relation to FIG. 2.

The invention shall of course not be limited to the shown embodiments but may be varied freely within the scope of the claims. For example, the detecting device 7 does not have to comprise directional couplers but also other means for power detection are possible. Also, it is not necessary that the receiver and transmitter filters respectively comprise just one filter but it is also possible they have two interconnected filters even if this mostly implies that the arrangement as such will be somewhat larger. Also, the PI-regulator of course may be any other kind of a regulator, or separate attenuating means 10 could be arranged behind the amplifier, etc. The use of the arrangement is of course not limited to so called hand-held telephones but it may be used everywhere for duplex transmission in a radio or similar device comprising a transmitter and receiver, e.g., in so called cordless telephones, etc.

What is claimed is:

1. A communication apparatus having a transmitter and receiver for duplex transmission comprising:

a power amplifier;

a transmitter filter having an input connected to an output of the power amplifier;

a circulator;

a receiver filter, wherein the receiver filter comprises a Surface Acoustic Wave (SAW) filter and is connected to an output of the transmitter filter via the circulator;

means for controlling power produced by the power amplifier to thereby limit damage to the receiver filter;

a transmitter/receiver device which is demountably connected to the circulator; and means for detecting and measuring power into the receiver filter, wherein the power detecting means provides a feed-back signal to the controlling means.

2. The apparatus of claim 1, wherein the power detecting and measuring means is connected to the power amplifier.

3. The apparatus of claim 2, wherein if the power detected by the power detecting and measuring means exceeds a predetermined level, the power amplifier is controlled to reduce the power produced.

4. The apparatus of claim 3, wherein the controlling means comprises a power regulator for controlling the power produced by the power amplifier, and the power regulator causes the reduction therein if the transmitter/receiver device loads the circulator improperly.

5. The apparatus of claim 4, wherein the power regulator comprises a proportional integral regulator.

6. The apparatus of claim 1, wherein the power detecting and measuring means is disposed between the circulator and the receiver filter.

7. The apparatus of claim 6, wherein the power detecting and measuring means comprises a directional coupler.

8. The apparatus of claim 1, wherein the power detecting and measuring means comprises at least one directional coupler.

9. The apparatus of claim 1, wherein the power detecting and measuring means comprises a first directional coupler connected between the circulator and the receiver filter and a second directional coupler connected in front of the transmitter filter.

10. The apparatus of claim 9, wherein the second directional coupler is connected between the power amplifier and transmitter filter.

11. The apparatus of claim 1, wherein the power detecting and measuring means comprises a first directional coupler connected between the circulator and the receiver filter and a second directional coupler connected between the transmitter filter and the circulator.

12. The apparatus of claim 1, wherein the circulator has a through-attenuation of approximately 0.8 dB and a reverse isolation of at least approximately 12 dB.

13. The apparatus of claim 1, wherein the transmitter filter comprises a ceramic filter.

14. The apparatus of claim 1, wherein the transmitter filter comprises a helical filter.

15. The apparatus of claim 1, wherein the transmitter/receiver device comprises one of an antenna and a cable.

16. The apparatus of claim 15, wherein inputs and outputs of the transmitter, the receiver, and the transmitter/receiver device are loaded with an impedance of approximately 50 Ω.

17. A communication apparatus comprising: a transmitter connected with a transmitter filter, a receiver connected with a receiver filter, and an antenna, the transmitter filter and the receiver filter being connected through a circulator, means for detecting power to be received by the receiver filter and means for controlling and regulating power produced by a power amplifier of the transmitter to thereby limit damage to the receiver filter.

* * * * *